(12) United States Patent
Lee

(10) Patent No.: US 9,325,301 B2
(45) Date of Patent: Apr. 26, 2016

(54) RAMP SIGNAL GENERATOR AND IMAGE SENSOR INCLUDING THE SAME

(71) Applicant: Samsung Electronics Co., Ltd., Suwon-si (KR)

(72) Inventor: Hyeok-Jong Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 14/230,365

(22) Filed: Mar. 31, 2014

(65) Prior Publication Data

US 2014/0375858 A1    Dec. 25, 2014

(51) Int. Cl.
| | |
|---|---|
| G06G 7/22 | (2006.01) |
| H03K 4/02 | (2006.01) |
| H04N 5/378 | (2011.01) |
| H04N 5/3745 | (2011.01) |

(52) U.S. Cl.
CPC ............ *H03K 4/026* (2013.01); *H04N 5/378* (2013.01); *H04N 5/37455* (2013.01)

(58) Field of Classification Search
CPC .... H03K 4/026; H04N 5/37455; H04N 5/378
USPC ......................................................... 708/852
See application file for complete search history.

(56) References Cited

U.S. PATENT DOCUMENTS

| | | | | |
|---|---|---|---|---|
| 5,124,597 | A * | 6/1992 | Stuebing | H03K 5/133 327/261 |
| 5,642,067 | A * | 6/1997 | Grace | H03K 4/94 327/130 |
| 6,473,359 | B1 | 10/2002 | Mitarashi | |
| 6,903,671 | B2 | 6/2005 | Kwon et al. | |
| 7,012,557 | B2 | 3/2006 | Takayanagi et al. | |
| 7,948,415 | B2 | 5/2011 | Asayama et al. | |
| 8,274,416 | B2 | 9/2012 | Kawagushi et al. | |
| 8,279,311 | B2 | 10/2012 | Lim | |
| 8,339,300 | B2 | 12/2012 | Asayama et al. | |
| 8,350,941 | B2 | 1/2013 | Kukita | |
| 2006/0164277 | A1* | 7/2006 | Lee | G06J 1/00 341/155 |
| 2010/0259660 | A1 | 10/2010 | Kukita | |
| 2011/0292260 | A1 | 12/2011 | Hagihara | |
| 2013/0201375 | A1 | 8/2013 | Kukita | |

FOREIGN PATENT DOCUMENTS

| | | |
|---|---|---|
| JP | 2010251957 | 11/2010 |
| KR | 2004099887 | 12/2004 |

* cited by examiner

*Primary Examiner* — Tan V. Mai
(74) *Attorney, Agent, or Firm* — Onello & Mello LLP

(57) ABSTRACT

A ramp signal generator includes a rising-edge current unit, a falling-edge current unit and a current-voltage converter. The rising-edge current unit provides a rising-edge output current that sequentially increases or decreases in synchronization with rising edges of a clock signal. The falling-edge current unit provides a falling-edge output current that sequentially increases or decreases in synchronization with falling edges of the clock signal. The current-voltage converter outputs a ramp voltage by converting a summed current of the rising-edge output current and the falling-edge output current.

20 Claims, 12 Drawing Sheets

RAMP SIGNAL GENERATOR AND IMAGE SENSOR INCLUDING THE SAME

CROSS-REFERENCE TO RELATED APPLICATION

This application claims priority under 35 USC §119 to Korean Patent Application No. 10-2013-0073281, filed on Jun. 25, 2013, in the Korean Intellectual Property Office (KIPO), the contents of which are herein incorporated by reference in their entirety.

BACKGROUND

1. Technical Field

Exemplary embodiments in accordance with principles of inventive concepts relate generally to semiconductor devices and more particularly to a ramp signal generator and an image sensor including the ramp signal generator.

2. Description of the Related Art

A digital system may require digital signal processing to convert an analog signal, which is received from the outside, to a digital signal. An analog to digital converter (ADC) may be included in the digital system to convert the analog signal to the digital signal. A CMOS image sensor (CIS), for example, may convert light which is received from outside to electrical analog signal and then convert the electrical analog signal to a digital signal, which may then be processed using digital signal processing techniques and devices.

A single slop analog to digital converter (SS-ADC) may be used in a CMOS image sensor. The SS-ADC has several advantages, such as low-power and low-noise, but the speed of an SS-ADC may be problematic, particularly when processing high resolution video.

SUMMARY

Exemplary embodiments in accordance with principles of inventive concepts include a ramp signal generator that includes a rising-edge current unit configured to provide a rising-edge output current sequentially increasing or decreasing in synchronization with rising edges of a clock signal; a falling-edge current unit configured to provide a falling-edge output current sequentially increasing or decreasing in synchronization with falling edges of the clock signal; and a current-voltage converter configured to output a ramp voltage by converting a summed current of the rising-edge output current and the falling-edge output current.

Exemplary embodiments in accordance with principles of inventive concepts include a ramp signal generator wherein the ramp voltage increases by two steps per cycle of the clock signal.

Exemplary embodiments in accordance with principles of inventive concepts include a ramp signal generator, wherein the rising-edge current unit includes a rising-edge control unit configured to provide control signals in synchronization with the rising edges of the clock signal; and a rising-edge current cell array configured to provide the rising-edge output current by summing unit currents based on the rising control signals, and wherein the falling-edge current unit includes: a falling-edge control unit configured to provide control signals in synchronization with the falling edges of the clock signal; and a falling-edge current cell array configured to provide the falling-edge output current by summing unit currents based on the falling control signals.

Exemplary embodiments in accordance with principles of inventive concepts include a ramp signal generator wherein the rising-edge control unit includes a rising-edge row decoder configured to generate rising-edge row select signals in synchronization with the rising edges of the clock signal and a rising-edge column decoder configured to generate rising-edge column select signals in synchronization with the rising edges of the clock signal, and wherein the falling-edge control unit includes: a falling-edge row decoder configured to generate falling-edge row select signals in synchronization with the falling edges of the clock signal; and a falling-edge column decoder configured to generate falling-edge column select signals in synchronization with the falling edges of the clock signal.

Exemplary embodiments in accordance with principles of inventive concepts include a ramp signal generator of wherein the rising-edge current cell array includes current cells providing the unit current respectively, the current cells configured to be turned on sequentially based on control signals generated by the rising-edge control unit, and wherein the falling-edge current cell array includes current cells providing the unit current respectively, the current cells configured to be turned on sequentially based on control signals generated by the falling-edge control unit.

Exemplary embodiments in accordance with principles of inventive concepts include a ramp signal generator wherein the current cells in the rising-edge current cell array and the falling-edge current cell array are turned off simultaneously in response to a reset signal and the current cells stop providing the unit currents simultaneously.

Exemplary embodiments in accordance with principles of inventive concepts include a ramp signal generator wherein each of the current cells in the rising-edge current cell array turns on when a corresponding rising-edge row select signal among the rising-edge row select signals and a corresponding rising-edge column select signal among the rising-edge column select signals are activated, and wherein each of the current cells in the falling-edge current cell array turns on when a corresponding falling-edge row select signal among the falling-edge row select signals and a corresponding falling-edge column select signal among the falling-edge column select signals are activated.

Exemplary embodiments in accordance with principles of inventive concepts include a ramp signal generator wherein the current cells of the rising-edge current cell array provide the unit currents continuously, even though the corresponding rising-edge row select signal or the corresponding rising-edge column select signal is deactivated, and wherein the current cells of the falling-edge current cell array provide the unit currents continuously, even though the corresponding falling-edge row select signal or the corresponding falling-edge column select signal is deactivated.

Exemplary embodiments in accordance with principles of inventive concepts include a ramp signal generator wherein each of the current cells in the rising-edge current cell array includes a rising switch signal generator configured to generate a rising switch signal that is activated in response to the corresponding rising-edge row select signal among the rising-edge row select signals and the corresponding rising-edge column select signal among the rising-edge column select signals, and wherein each of the current cells in the falling-edge current cell array includes a falling switch signal generator configured to generate a falling switch signal that is activated in response to the corresponding falling-edge row select signal among the falling-edge row select signals and the corresponding falling-edge column select signal among the falling-edge column select signals.

Exemplary embodiments in accordance with principles of inventive concepts include a ramp signal generator wherein each of the current cells in the rising-edge current cell array further includes a rising-edge unit current generator configured to provide the unit current in response to the rising switch signal from the rising switch signal generator, and wherein each of the current cells in the falling-edge current cell array further includes a falling-edge unit current generator configured to provide the unit current in response to the falling switch signal from the falling switch signal generator.

Exemplary embodiments in accordance with principles of inventive concepts include a ramp signal generator wherein the rising-edge unit current generator includes a rising unit current source configured to provide the unit current; and a rising-edge current switch configured to connect the rising unit current source to the current-voltage converter in response to the rising switch signal, and wherein the falling-edge unit current generator includes a falling unit current source configured to provide the unit current; and a falling-edge current switch configured to connect the falling unit current source to the current-voltage converter in response to the falling switch signal.

Exemplary embodiments in accordance with principles of inventive concepts include a ramp signal generator of claim 11, wherein the rising-edge unit current generator further includes a rising-edge stop switch configured to connect the rising unit current source to a ground voltage in response to an inversion signal of the rising switch signal, and wherein the falling-edge unit current generator further includes a falling-edge stop switch configured to connect the falling unit current source to the ground voltage in response to an inversion signal of the falling switch signal.

Exemplary embodiments in accordance with principles of inventive concepts include a ramp signal generator wherein the current-voltage convertor includes a resistor connected between an output node of the ramp voltage and a ground voltage to convert the summed current to the ramp voltage.

Exemplary embodiments in accordance with principles of inventive concepts include a ramp signal generator including a shift rising-edge current unit configured to provide a shift rising-edge output current sequentially increasing or decreasing in synchronization with rising edges of a shift clock signal that is phase-shifted by 90 degrees with respect to the clock signal; and a shift falling-edge current unit configured to provide a shift falling-edge output current sequentially increasing or decreasing in synchronization with falling edges of the shift clock signal, wherein the current-voltage converter is configured to output the ramp voltage by converting the summed current of the rising-edge output current, the falling-edge output current, the shift rising-edge output current and the shift falling-edge output current.

Exemplary embodiments in accordance with principles of inventive concepts include a ramp signal generator wherein one of the rising-edge current unit and the falling-edge current unit is activated selectively in response to an enable signal, and wherein one of the shift rising-edge current unit and the shift falling-edge current unit is activated selectively in response to a shift enable signal.

Exemplary embodiments in accordance with principles of inventive concepts include an image sensor including a pixel array including a plurality of pixels configured to convert incident light to an electrical signal; a ramp signal generator configured to generate a ramp voltage; and a control unit configured to output a digital electrical signal corresponding to the electronic signal based on the ramp voltage, wherein the ramp signal generator includes a rising-edge current unit configured to provide a rising-edge output current sequentially increasing or decreasing in synchronization with rising edges of a clock signal a falling-edge current unit configured to provide a falling-edge output current sequentially increasing or decreasing in synchronization with falling edges of the clock signal; and a current-voltage converter configured to output a ramp voltage by converting a summed current of the rising-edge output current and the falling-edge output current.

Exemplary embodiments in accordance with principles of inventive concepts include a portable electronic device including a processor configured to receive digital data from an image sensor; an image sensor, including: a pixel array including a plurality of pixels configured to convert incident light to an electrical signal; a ramp signal generator configured to generate a ramp voltage; and an analog to digital converter configured to compare electrical signals from the pixel array to a reference signal from a ramp signal generated by a ramp signal generator, wherein the ramp signal generator includes: a current unit configured to provide an output current sequentially increasing or decreasing in synchronization with rising edges of a clock signal; a current unit configured to provide an output current sequentially increasing or decreasing in synchronization with falling edges of the clock signal; and a current-voltage converter configured to output a ramp voltage by converting a summed current of the rising-edge output current and the falling-edge output current.

Exemplary embodiments in accordance with principles of inventive concepts include a portable electronic device, wherein the portable electronic device includes a camera.

Exemplary embodiments in accordance with principles of inventive concepts include a portable electronic device wherein the portable electronic device is a smart phone.

Exemplary embodiments in accordance with principles of inventive concepts include a portable electronic device, wherein the portable electronic device is a computer.

BRIEF DESCRIPTION OF THE DRAWINGS

Illustrative, non-limiting exemplary embodiments in accordance with principles of inventive concepts will be more clearly understood from the following detailed description taken in conjunction with the accompanying drawings.

DETAILED DESCRIPTION OF THE EMBODIMENTS

Figure 1:
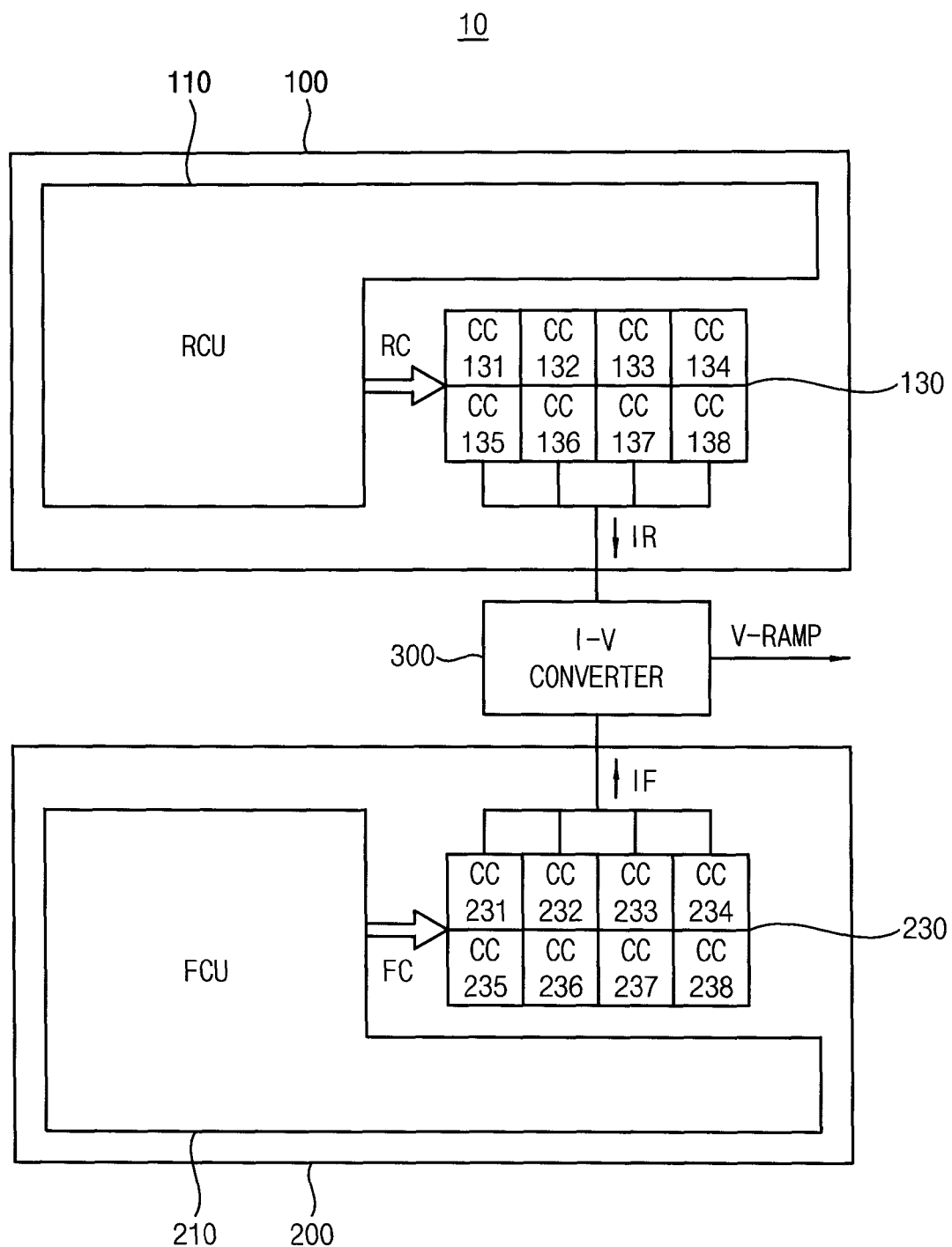
FIG. 1 is a block diagram illustrating a ramp signal generator according to exemplary embodiments in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example, may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that teens, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

FIG. 1 is a block diagram illustrating an exemplary embodiment of a ramp signal generator in accordance with principles of inventive concepts. Ramp signal generator 10 may include a rising current unit 100 (also referred to herein as rising-edge current unit 100), a falling current unit 200 (also referred to herein as falling-edge current unit 200) and a current-voltage converter 300.

The rising-edge current unit 100 provides rising output current IR, also referred to herein as rising-edge output current IR, that sequentially increases or decreases in synchronization with rising edges of a clock signal CLK. The falling-edge current unit 200 provides falling output current IF, also referred to herein as falling-edge output current IF, that sequentially increases or decreases in synchronization with falling edges of the clock signal CLK. As will be described in the discussion related to FIG. 6, the current-voltage converter 300 outputs a ramp voltage V-RAMP by converting the summed current IT of the rising-edge output current IR and the falling-edge output current IF.

The clock signal CLK used in the rising-edge current unit 100 and the falling-edge current unit 200 may be supplied from outside the ramp signal generator 10. The rising-edge current unit 100 may generate the rising-edge output current IR such that the magnitude of the rising-edge output current IR is sequentially increased or decreased by a predetermined amount at every rising edge of the clock signal CLK. The falling-edge current unit 200 may generate the falling-edge output current IF such that the magnitude of the falling-edge output current IF is sequentially increased or decreased by a predetermined amount at every falling edge of the clock signal CLK.

The falling-edge current unit 200 may operate in response to an inversion clock signal /CLK of the clock signal CLK. In such exemplary embodiments, the falling-edge current unit 200 may provide the falling-edge output current IF sequentially increasing or decreasing in synchronization with rising edges of the inversion clock signal /CLK. The current-voltage converter 300 may output the ramp voltage V-RAMP by converting the summed current IT of the rising-edge output current IR and the falling-edge output current IF.

A ramp signal generator 10 in accordance with principles of inventive concepts may operate faster than a conventional ramp signal generator using only the rising edges of the clock signal CLK, because ramp signal generator 10 generates the ramp signal in synchronization with both the rising and falling edges of the clock signal CLK.

In accordance with principles of inventive concepts, ramp voltage V-RAMP may increase by two steps per cycle of the clock signal CLK. In exemplary embodiments a predetermined current amount, a unit current (UI), may be used for both rising-edge current unit 100 and falling-edge current unit 200 and, in such embodiments current is increased twice per clock cycle (that is, two unit-current steps, per clock cycle), yielding two step increases in the ramp voltage V-RAMP. In other exemplary embodiments in accordance with principles of inventive concepts, the ramp voltage V-RAMP may decrease by two steps per cycle of the clock signal CLK.

As illustrated in the exemplary embodiment of FIG. 1, the rising-edge current unit 100 may include a rising control unit RCU 110 (also referred to herein as a rising-edge control unit RCU 110), and a rising current cell array 130 (also referred to herein as a rising-edge current cell array 130), and the falling current unit 200 (also referred to herein as a falling-edge current unit 200), may include a falling control unit FCU 210 (also referred to herein as falling-edge control unit FCU 210), and a falling current cell array 230 (also referred to herein as falling-edge current cell array 230).

The rising-edge control unit 110 may provide rising control signals RC in synchronization with the rising edges of the clock signal CLK. The rising-edge current cell array 130 may provide the rising-edge output current IR by summing unit currents IU based on the rising control signals RC. The falling-edge control unit 210 may provide falling control signals FC in synchronization with the falling edges of the clock signal CLK. The falling-edge current cell array 230 may provide the falling-edge output current IF by summing unit currents IU based on the falling control signals FC.

Figure 2:
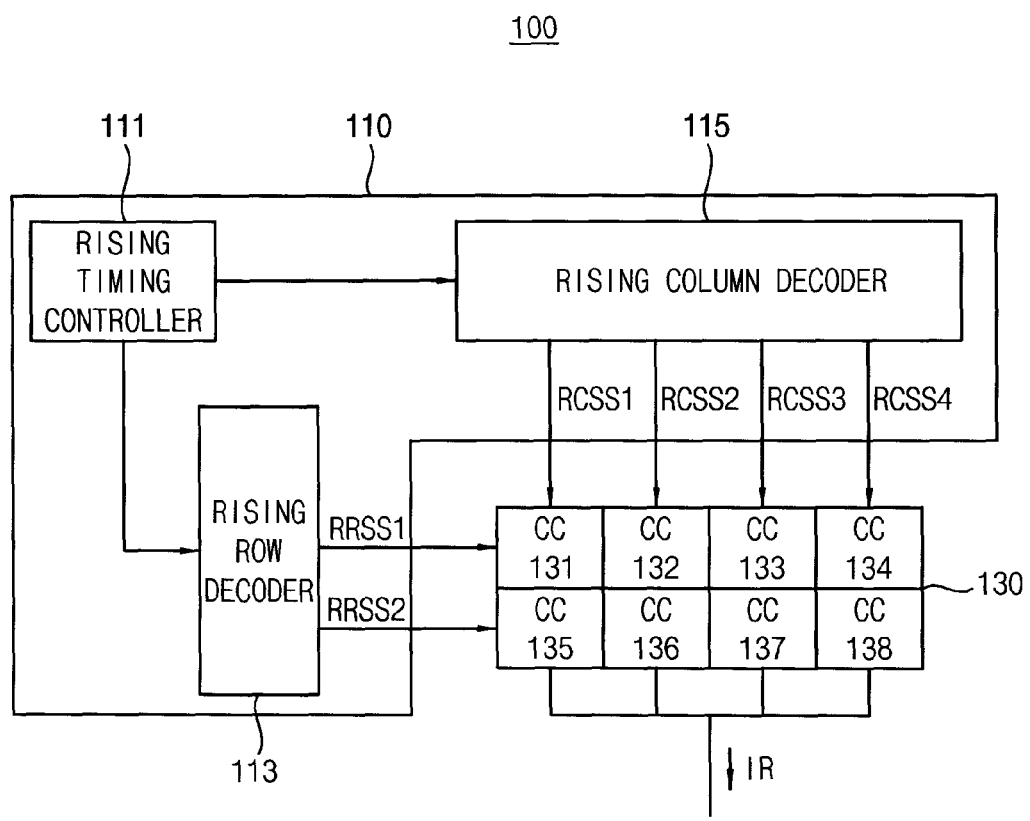
FIG. 2 is a block diagram illustrating an example of a rising current unit, also referred to herein as a rising-edge current unit, included in the ramp signal generator of FIG. 1.
Figure 3:
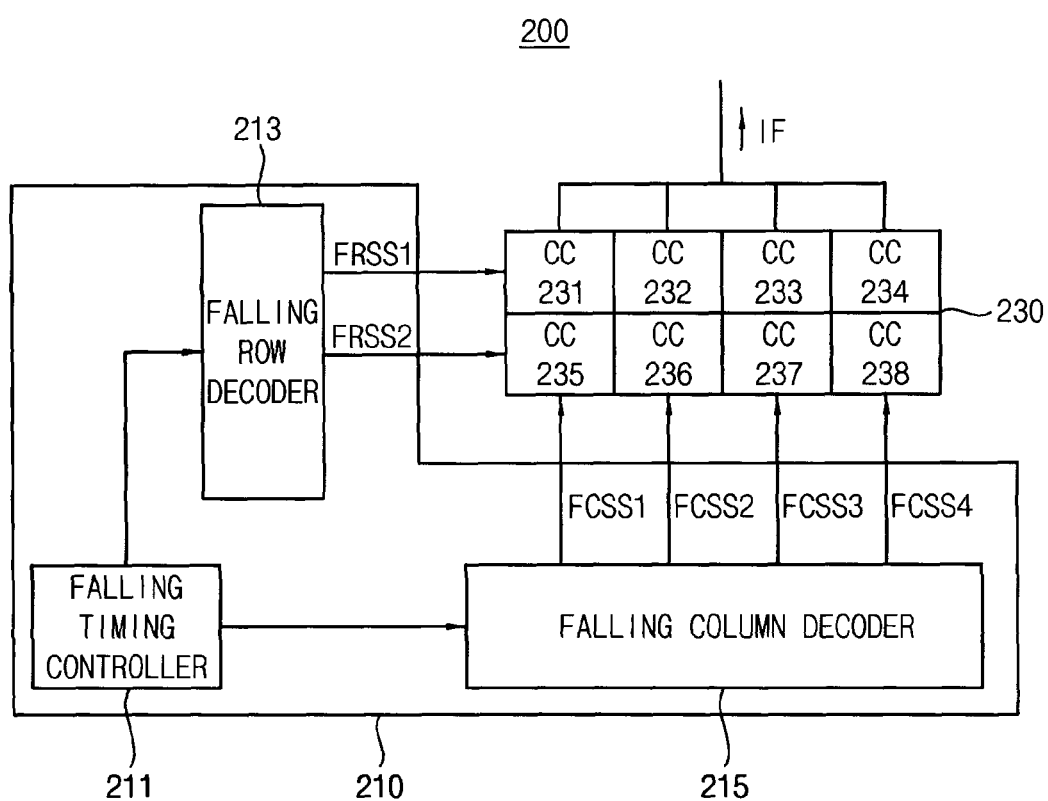
FIG. 3 is a block diagram illustrating an example of a falling current unit, also referred to herein as a falling-edge current unit included in the ramp signal generator of FIG. 1.

FIG. 2 is a block diagram illustrating an exemplary embodiment of a rising-edge current unit 100 included in the ramp signal generator 10 of FIG. 1. FIG. 3 is a block diagram illustrating an exemplary embodiment of a falling-edge current unit 200 included in the ramp signal generator 10 of FIG. 1. The rising-edge control unit 110 may include a rising row decoder 113 (also referred to herein as rising-edge row decoder 113) and a rising column decoder 115 (also referred to herein as rising-edge column decoder 115), and the falling-edge control unit 210 may include a falling row decoder 213 (also referred to herein as falling-edge row decoder 213) and a falling column decoder 215 (also referred to herein as falling-edge column decoder 215).

The rising-edge row decoder 113 may generate rising-edge row select signals RRSS1 and RRSS2 in synchronization with the rising edges of the clock signal CLK. The rising-edge column decoder 115 may generate rising-edge column select signals RCSS1, RCSS2, RCSS3 and RCSS4 in synchronization with the rising edges of the clock signal CLK. The falling-edge row decoder 213 may generate falling-edge row select signals FRSS1 and FRSS2 in synchronization with the falling edges of the clock signal CLK. The falling-edge column decoder 215 may generate falling-edge column select signals FCSS1, FCSS2, FCSS3 and FCSS4 in synchronization with the falling edges of the clock signal CLK.

The row select signals RRSS1, RRSS2, FRSS1 and FRSS2 and the column select signals RCSS1, RCSS2, RCSS3, RCSS4, FCSS1, FCSS2, FCSS3 and FCSS4 respectively generated from the rising and the falling-edge row decoders 113 and 213 and the rising and falling-edge column decoders 115 and 215 may be used as signals controlling the current cell arrays 130 and 230. The current cell arrays 130 and 230 may increase the summed current IT of the rising and falling-edge output currents IR and IF sequentially by the unit current IU in response to the row select signals RRSS1, RRSS2, FRSS1 and FRSS2 and the column select signals RCSS1, RCSS2, RCSS3, RCSS4, FCSS1, FCSS2, FCSS3 and FCSS4. The ramp voltage V-RAMP may be output based on the summed current IT of the rising-edge output current IR and the falling-edge output current IF.

In other exemplary embodiments in accordance with principles of inventive concepts, the current cell arrays 130 and 230 may decrease sequentially the unit current IU by the row select signals RRSS1, RRSS2, FRSS1 and FRSS2 and the column select signals RCSS1, RCSS2, RCSS3, RCSS4, FCSS1, FCSS2, FCSS3 and FCSS4.

The rising and the falling-edge control units 110 and 210 may include a rising timing controller 111 and a falling timing controller 211, respectively. The rising timing controller 111 may provide the clock signal CLK to the rising-edge row decoder 113 and the rising-edge column decoder 115. The rising-edge row decoder 113 and the rising-edge column decoder 115 may provide the rising control signals RC controlling the current cell array in synchronization with the clock signal CLK supplied from the rising timing controller 111. The above-mentioned operation of the rising timing controller 111 may be similarly applied to the operation of the falling timing controller 211.

In exemplary embodiments in accordance with principles of inventive concepts, the column select signals RCSS1, RCSS2, RCSS3, RCSS4, FCSS1, FCSS2, FCSS3 and FCSS4 may be activated sequentially. While a column select signal of the column select signals RCSS1, RCSS2, RCSS3, RCSS4, FCSS1, FCSS2, FCSS3 and FCSS4 is activated, the row select signals RRSS1, RRSS2, FRSS1 and FRSS2 may be activated sequentially. In other exemplary embodiments in accordance with principles of inventive concepts, the row select signals RRSS1, RRSS2, FRSS1 and FRSS2 may be activated sequentially. While a row select signal of the row select signals RRSS1, RRSS2, FRSS1 and FRSS2 is activated, the column select signals RCSS1, RCSS2, RCSS3, RCSS4, FCSS1, FCSS2, FCSS3 and FCSS4 may be activated sequentially.

The rising-edge current cell array 130 may include current cells CC 131, 132, 133, 134, 135, 136, 137 and 138, each capable of respectively providing current in the amount of the unit current IU. The current cells CC 131, 132, 133, 134, 135, 136, 137 and 138 may be turned on sequentially based on the rising control signals RC so that the current cells 131 to 138 may provide the rising-edge output current IR that increases sequentially by the unit current IU. The falling-edge current cell array 230 may include current cells 231, 232, 233, 234, 235, 236, 237 and 238, each capable of respectively providing current in the amount of the unit current IU. The current cells CC 231, 232, 233, 234, 235, 236, 237 and 238 may be turned on sequentially based on the falling control signals FC so that the current cells 231 to 238 may provide the falling-edge output current IR that increases sequentially by the unit current IU.

In other exemplary embodiments in accordance with principles of inventive concepts, the current cells 131 to 138 may be turned off sequentially based on the rising control signals RC so that the current cells 131 to 138 may provide a rising-edge output current IR that decreases sequentially by the unit current IU. The current cells 231 to 238 may be turned off sequentially based on the falling control signals FC so that the current cells 231 to 238 may provide a falling-edge output current IF that decreases sequentially by the unit current IU.

The rising control signals RC may be the rising-edge row select signals RRSS1 and RRSS2 and the rising-edge column select signals RCSS1, RCSS2, RCSS3 and RCSS4 in synchronization with the rising edges of the clock signal CLK. The falling control signals FC may be the falling-edge row select signals FRSS1 and FRSS2 and the falling-edge column select signals FCSS1, FCSS2, FCSS3 and FCSS4 in synchronization with the falling edges of the clock signal CLK. The rising-edge row select signals RRSS1 and RRSS2, the rising-edge column select signals RCSS1, RCSS2, RCSS3 and RCSS4, the falling-edge row select signals FRSS1 and FRSS2 and the falling-edge column select signals FCSS1, FCSS2, FCSS3 and FCSS4 may be used to sequentially turn on the current cells 131 to 138 and 231 to 238 of the rising and falling-edge current cell arrays 130 and 230.

In other exemplary embodiments in accordance with principles of inventive concepts, the rising-edge row select signals RRSS1 and RRSS2, the rising-edge column select signals RCSS1, RCSS2, RCSS3 and RCSS4, the falling-edge row select signals FRSS1 and FRSS2 and the falling-edge column select signals FCSS1, FCSS2, FCSS3 and FCSS4 may be used to sequentially turn off the current cells of the rising and falling-edge current cell arrays 130 and 230.

Figure 4:
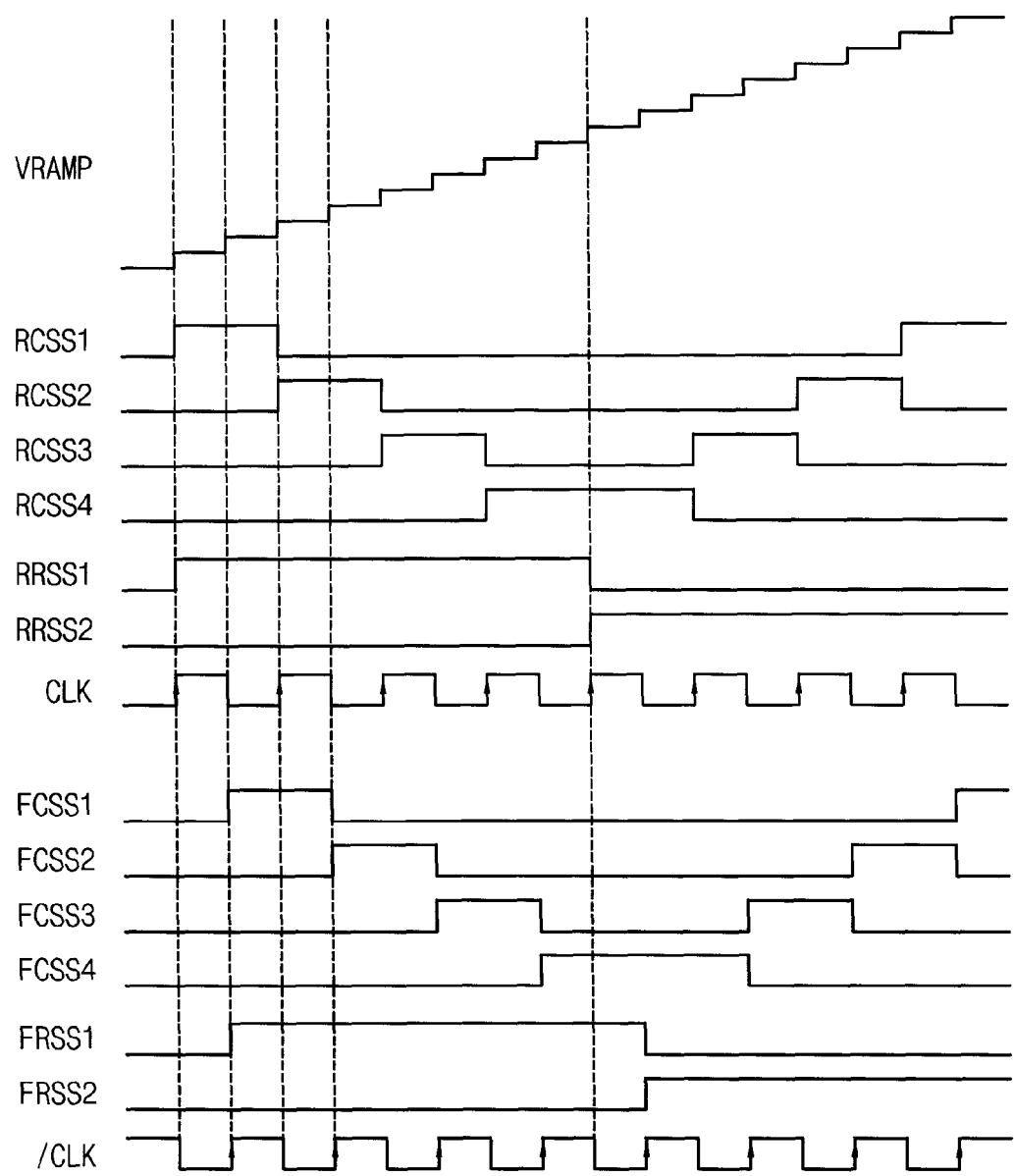
FIG. 4 is a timing diagram illustrating an operation of the ramp signal generator of FIG. 1.
Figure 5:
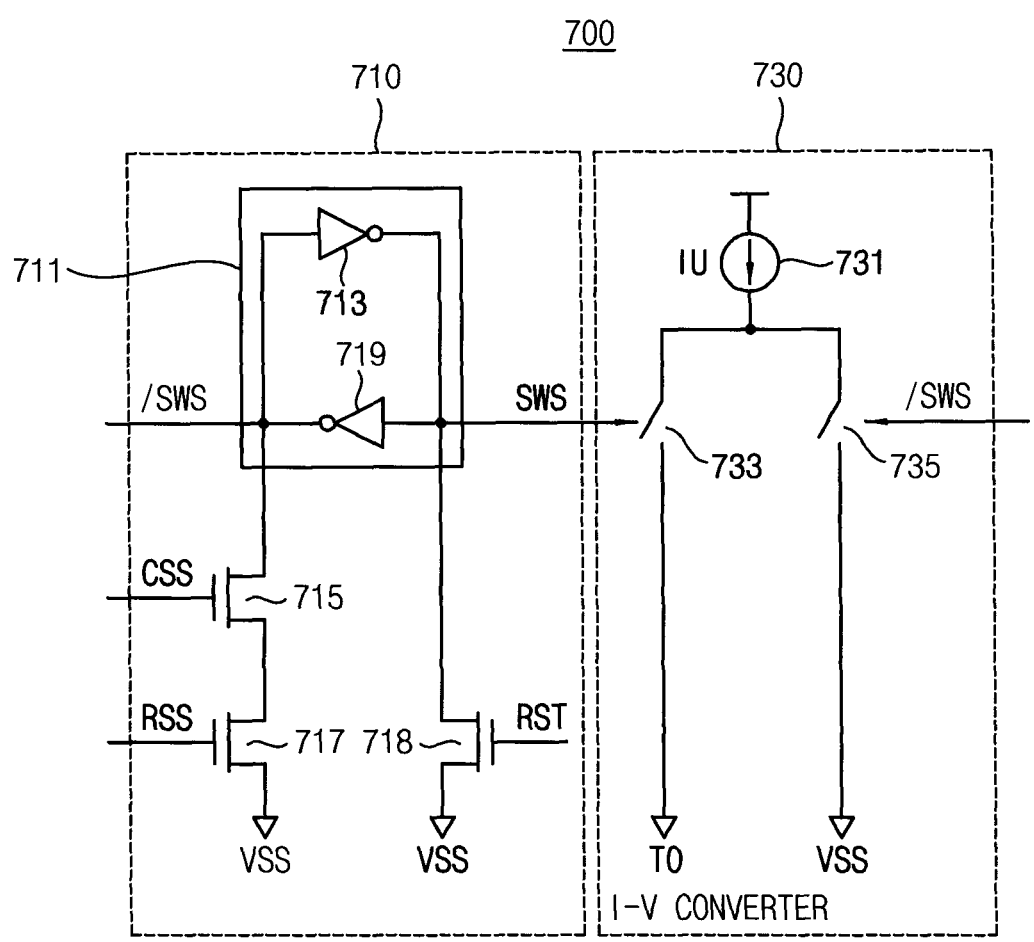
FIG. 5 is a diagram illustrating an example of a current cell included in the ramp signal generator of FIG. 1.

FIG. 4 is a timing diagram illustrating operation of an exemplary embodiment of a ramp signal generator in accordance with principles of inventive concepts, such as that of FIG. 1 and FIG. 5 is a diagram illustrating an exemplary embodiment of a current cell included in a ramp signal generator in accordance with principles of inventive concepts such as that of FIG. 1.

Referring to FIG. 4 and FIG. 5, the row select signals RRSS1, RRSS2, FRSS1 and FRSS2 and the column select signals RCSS1, RCSS2, RCSS3, RCSS4, FCSS1, FCSS2, FCSS3 and FCSS4 of FIG. 4 may be connected to row select switches 717 and column select switches 715 of FIG. 5 respectively. If the first rising-edge row select signal RRSS1 and the first rising-edge column select signal RCSS1 are activated, the row select switch 717 and the column select switch 715 of the corresponding current cell of the rising-edge current unit 100 may be turned on. If the row select switch 717 and the column select switch 715 are turned on, the ground voltage VSS is applied to an input of a first inverter 713 of a latch circuit 711 and the rising switch signal SWS maintains a logic-high. As a result, a current switch 733 is turned on. If the current switch 733 is turned on, a conduction path from a unit current source 731 to the current-voltage converter 300 is formed and, as a result, unit current IU may be transferred to the current-voltage converter 300 through the conduction path and the ramp voltage V-RAMP may increase one step.

If the first falling-edge row select signal FRSS1 and the first falling-edge column select signal FCSS1 are activated, the row select switch 717 and the column select switch 715 of the corresponding current cell of the falling-edge current unit 200 may be turned on. If the row select switch 717 and the column select switch 715 are turned on, the ground voltage VSS is applied to an input of the first inverter 713 of the latch circuit 711 and the falling switch signal SWS maintains a logic-high and the current switch 733 is turned on. If the current switch 733 is turned on, a conduction path from a unit current source 731 to the current-voltage converter 300 is formed and, as a result, a unit current IU may be transferred to the current-voltage converter 300 through the conduction path and the ramp voltage V-RAMP may increase one more step. In exemplary embodiments in accordance with principles of inventive concepts, ramp signal V-RAMP is formed repeating the same process each cycle of the clock signal CLK. If a ramp signal generator in accordance with principles of inventive concepts, such as that of signal generator 10 is used, the ramp voltage V-RAMP may increase two steps each cycle of the clock signal CLK.

If one of the rising-edge row select signal or the rising-edge column select signal is deactivated, the corresponding column select switch 715 or row select switch 717 of the current cells 131 to 138 of the rising-edge current unit 100 is deactivated. If the column select switch 715 or the row select switch 717 is deactivated, an initial state is maintained. The initial state may be a reset state, for example, in which the ground voltage VSS is applied to an input node of the second inverter 719 of the latch circuit 711 and rising switch signal SWS maintains the logic-low and the current switch 733 is turned off. If the current switch 733 is turned off, the conduction path from the unit current source 731 to the ground voltage VSS is formed. The unit current IU may be transferred to the ground through the conduction path and the ramp voltage V-RAMP may remain unchanged. The operations of the current cell deactivation of the rising-edge current unit 100 may be applied to the operations of the current cell deactivation of the falling-edge current unit 200.

In operation of the ramp signal generator 10, the column select signals RCSS1, RCSS2, RCSS3, RCSS4, FCSS1, FCSS2, FCSS3 and FCSS4 and the row select signals RRSS1, RRSS2, FRSS1 and FRSS2 may be changed. If the column select signals RCSS1, RCSS2, RCSS3, RCSS4, FCSS1, FCSS2, FCSS3 and FCSS4 and the row select signals RRSS1, RRSS2, FRSS1 and FRSS2 are changed simultaneously, glitches (that is, unwanted signal spikes) may be generated. To prevent glitches, the column select signals RCSS1, RCSS2, RCSS3, RCSS4, FCSS1, FCSS2, FCSS3 and FCSS4 and the row select signals RRSS1, RRSS2, FRSS1 and FRSS2 may be altered non-simultaneously.

Referring to FIG. 5, the current cells 131 to 138 may stop supplying the unit current IU in response to a reset signal RST. If the reset signal RST is turned on, the current switch 733 may be connected to the ground voltage VSS. If the current switch 733 is connected to the ground voltage VSS, the conduction path from the unit current source 731 to the current-voltage converter 300 is not formed. As a result, the unit current IU being supplied to the current-voltage converter 300 may be stopped. If the stop switch 735 is turned on, the conduction path from the unit current source 731 to the ground voltage VSS is formed. The unit current IU may be transferred to the ground voltage VSS throughout the conduction path.

Each of the current cells 131 to 138 in the rising-edge current cell array 130 may turn on when the corresponding rising-edge row select signal among the rising-edge row select signals RRSS1 and RRSS2 and the corresponding rising-edge column select signal among the rising-edge column select signals RCSS1, RCSS2, RCSS3 and RCSS4 are activated. Each of the current cells 231 to 238 in the falling-edge current cell array 230 may turn on when the corresponding falling-edge row select signal among the falling-edge row select signals FRSS1 and FRSS2 and the corresponding falling-edge column select signal among the falling-edge column select signals FCSS1, FCSS2, FCSS3 and FCSS4 are activated.

Each of the current cells 131 to 138 in the rising-edge current cell array 130 may turn off when the corresponding rising-edge row select signal among the rising-edge row select signals RRSS1 and RRSS2 and the corresponding rising-edge column select signal among the rising-edge column select signals RCSS1, RCSS2, RCSS3 and RCSS4 are activated. Each of the current cells 231 to 238 in the falling-edge current cell array 230 may turn off when the corresponding falling-edge row select signal among the falling-edge row select signals FRSS1 and FRSS2 and the corresponding falling-edge column select signal among the falling-edge column select signals FCSS1, FCSS2, FCSS3 and FCSS4 are activated.

The rising-edge column select signals RCSS1, RCSS2, RCSS3 and RCSS4 and the rising-edge row select signals RRSS1 and RRSS2 are applied to row select switches 717 and column select switches 715. If the rising-edge column select signals RCSS1, RCSS2, RCSS3 and RCSS4 and the rising-edge row select signals RRSS1 and RRSS2 are activated, the corresponding column select switch 715 and the corresponding row select switch 717 of the current cell of the rising-edge current unit 100 are turned on. If the column select switch 715 and the row select switch 717 are turned on, the ground voltage VSS is applied to the input node of the first inverter 713 of the latch circuit 711 and the rising switch signal SWS maintains the logic-high and, as a result, current switch 733 is turned on. With the current switch 733 turned on, the conduction path from the unit current source 731 to the current-voltage converter 300 is formed and a unit current IU may be transferred to the current-voltage converter 300 through the conduction path and the ramp voltage V-RAMP may increase one step. The operation of the current cell activation of the rising-edge current unit 100 may be applied to the operation of the current cell activation of the falling-edge current unit 200.

In exemplary embodiments in accordance with principles of inventive concepts, current cells 131 to 138 of the rising-edge current cell array 130 may provide the unit currents IU continuously, even though the corresponding rising-edge row select signal or the corresponding rising-edge column select signal are deactivated. In exemplary embodiments in accordance with principles of inventive concepts, current cells 231 to 238 of the falling-edge current cell array 230 may provide the unit currents IU continuously, even though the corresponding falling-edge row select signal or the corresponding falling-edge column select signal FCSS1, FCSS2, FCSS3 and FCSS4 are deactivated.

Referring to FIG. 5, if the rising-edge column select signals RCSS1, RCSS2, RCSS3 and RCSS4 and the rising-edge row select signals RRSS1 and RRSS2 are activated, the corresponding the row select switch 717 and the column select switch 715 of the current cell of the rising-edge current unit 100 are turned on. If the column select switch 715 and the row select switch 717 are turned on, the activation state is maintained continuously by the latch circuit 711. The activation state is maintained regardless of the turning on or off of the rising-edge row select signals RRSS1 and RRSS2 and the rising-edge column select signals RCSS1, RCSS2, RCSS3 and RCSS4. However, the state of the current cell may be changed from the activation state to the deactivation state by the reset signal RST.

While the first row select signal is activated, the first to the fourth current cells 131, 132, 133 and 134 may be turned on sequentially if the first to the fourth the column select signal is activated sequentially. The first current cell may maintain the turned-on state even though the first column select signal is deactivated and the second column select signal is activated and, as a result, unit current IU is supplied continuously. The rising-edge output current IR of the current cell array may be sequentially increased by the unit current IU from one time to four times.

While the second row select signal is activated, the fifth to the eighth current cells 135, 136, 137 and 138 may be turned on sequentially if the first to the fourth the column select signal is activated sequentially. In exemplary embodiments in accordance with principles of inventive concepts, rising-edge output current IR of the current cell array may be sequentially increased by the unit current IU from five times to eight times and rising-edge output current IR of the current cell array may be sequentially increased by the unit current IU from one time to eight times.

Each of the current cells 131 to 138 in the rising-edge current cell array 130 may include a rising switch signal generator 710 configured to generate the rising switch signal SWS that is activated in response to the corresponding rising-edge row select signal among the rising-edge row select signals RRSS1 and RRSS2 and the corresponding rising-edge column select signal among the rising-edge column select signals RCSS1, RCSS2, RCSS3 and RCSS4. Each of the current cells 231 to 238 in the falling-edge current cell array 230 may include the falling switch signal generator 710 configured to generate the falling switch signal SWS that is activated in response to the corresponding falling-edge row select signal among the falling-edge row select signals FRSS1 and FRSS2 and the corresponding falling-edge column select signal among the falling-edge column select signals FCSS1, FCSS2, FCSS3 and FCSS4.

If the rising-edge row select signals RRSS1 and RRSS2 and the rising-edge column select signals RCSS1, RCSS2, RCSS3 and RCSS4 are activated, the row select switch 717 and the column select switch 715 of the corresponding current cell of the rising-edge current unit 100 may be turned on. If the row select switch 717 and the column select switch 715 are turned on, the ground voltage VSS is applied to the input of the first inverter 713 of the latch circuit 711 and the rising switch signal SWS maintains a logic-high and the current switch 733 is turned on and a conduction path from the unit current source 731 to the current-voltage converter 300 is formed. As a result unit current IU is transferred to the current-voltage converter 300 through the conduction path. The operations of the rising switch signal generator 710 of the rising-edge current unit 100 may be applied to the operations of the falling switch signal generator 710 of the falling-edge current unit 200.

In exemplary embodiments in accordance with principles of inventive concepts, rising switch signal SWS maintains the logic-high when the column select signals RCSS1, RCSS2, RCSS3, RCSS4, FCSS1, FCSS2, FCSS3 and FCSS4 and the row select signals RRSS1, RRSS2, FRSS1 and FRSS2 are activated together. The rising switch signal generator 710 may maintain the activation state of the rising switch signal SWS even though the column select signals RCSS1, RCSS2, RCSS3, RCSS4, FCSS1, FCSS2, FCSS3 and FCSS4 and/or the row select signals RRSS1, RRSS2, FRSS1 and FRSS2 is deactivated.

Each of the current cells 131 to 138 in the rising-edge current cell array 130 may further include a rising-edge unit current generator 730 to provide the unit current IU in response to the rising switch signal SWS from the rising switch signal generator 710. Each of the current cells 231 to 238 in the falling-edge current cell array 230 may further include a falling-edge unit current generator 730 to provide the unit current IU in response to the falling switch signal SWS from the falling switch signal generator 710.

In exemplary embodiments in accordance with principles of inventive concepts, rising-edge unit current generator 730 may include the rising unit current source 731 and the rising-edge current switch 733. The rising unit current source 731 may provide the unit current IU. The rising-edge current switch 733 may connect the rising unit current source 731 to the current-voltage converter 300 in response to the rising switch signal SWS. The falling-edge unit current generator 730 may include the falling unit current source 731 and the falling-edge current switch 733. The falling unit current source 731 may provide the unit current IU. The falling-edge current switch 733 may connect the falling unit current source 731 to the current-voltage converter 300 in response to the falling switch signal SWS.

If the row select switch 717 and the column select switch 715 are turned on, the ground voltage VSS is applied to the input of the first inverter 713 of the latch circuit 711 and the rising switch signal SWS maintains the logic-high and the current switch 733 is turned on. If the current switch 733 in the unit current source 731 is turned on, the conduction path from the unit current source 731 to the current-voltage converter 300 is formed and unit current IU may be transferred to the current-voltage converter 300 through the conduction path and the ramp voltage V-RAMP may be increased a step.

In accordance with principles of inventive concepts, rising-edge unit current generator 730 may include a rising-edge stop switch 735 configured to connect the rising unit current source 731 to a ground voltage VSS in response to an inversion (that is, inverted) signal of the rising switch signal SWS. In accordance with principles of inventive concepts, falling-edge unit current generator 730 may include the falling-edge stop switch 735 configured to connect the falling unit current source 731 to the ground voltage VSS in response to an inversion signal of the falling switch signal SWS.

In the deactivation state of the current switch 733, the unit current IU may be transferred to the ground voltage VSS using the stop switch 735 to prevent the unit current IU from being transferred to the current-voltage converter 300.

In accordance with principles of inventive concepts, switch signal generator 710 may include a reset transistor 718. The reset transistor 718 may be turned on in response to the reset signal RST. The reset signal RST may be provided from an outside device such as the timing controller, for example. If the reset signal RST is activated, the reset transistor 718 may be turned on and the switch signal SWS may maintain the logic-low, that is, the switch signal SWS is deactivated and the inversion signal, that is, inverted signal, of the switch signal /SWS is activated. Exemplary embodiments of a switch signal generator in accordance with principles of inventive concepts, such as switch signal generator 710 may be implemented with 7 transistors, thus offering a compact implementation.

Figure 6:
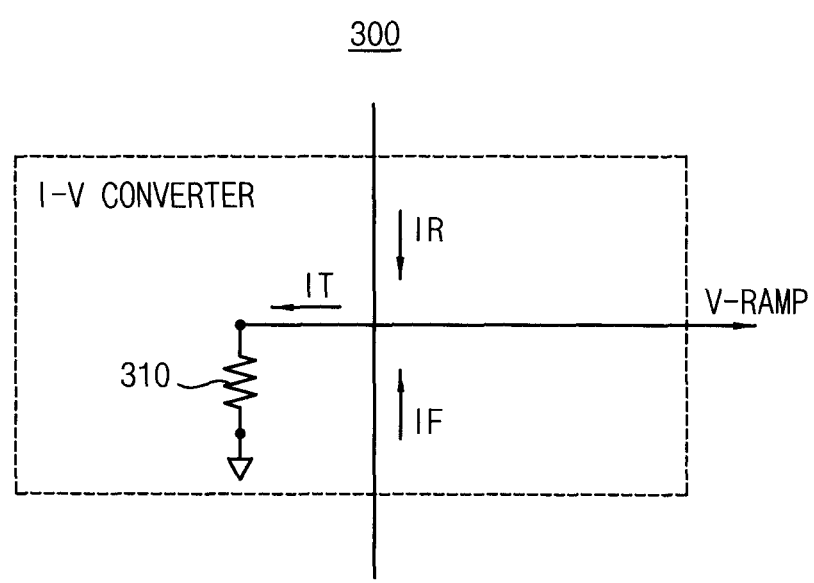
FIG. 6 is a diagram illustrating an example of a current-voltage converter included in the ramp signal generator of FIG. 1.

The circuit diagram of FIG. 6 illustrates an exemplary embodiment of a current-voltage converter in accordance with principles of inventive concepts, which may be included in the ramp signal generator of FIG. 1. Current-voltage convertor 300 may include a resistor 310 configured to be connected between an output node of the ramp voltage V-RAMP and the ground voltage VSS to convert the summed current IT to the ramp voltage V-RAMP. Using the resistor 310, the summed current IT may be converted to the ramp voltage V-RAMP. The voltage value of one step of the ramp voltage V-RAMP may depend upon the value of the resistor 310. The more the resistor 310 value is increased, the more the voltage value of one step of the ramp voltage V-RAMP may be increased.

In accordance with principles of inventive concepts, resistor 310 may be an adjustable resistor 310 and may determine the voltage value of one step of the ramp voltage V-RAMP. The value of resistor 310 may be related to the precision, resolution, or step-size, of the analog to digital converter 300 (ADC). If the input signal characteristic of the analog to digital converter 300 is known, the precision may be increased by decreasing the resistor 310 value to decrease the step size of the ADC 300 according to the input signal characteristic (for example, to fit the output range of the ADC to the voltage range of signals input to the ADC 300).

Figure 7:
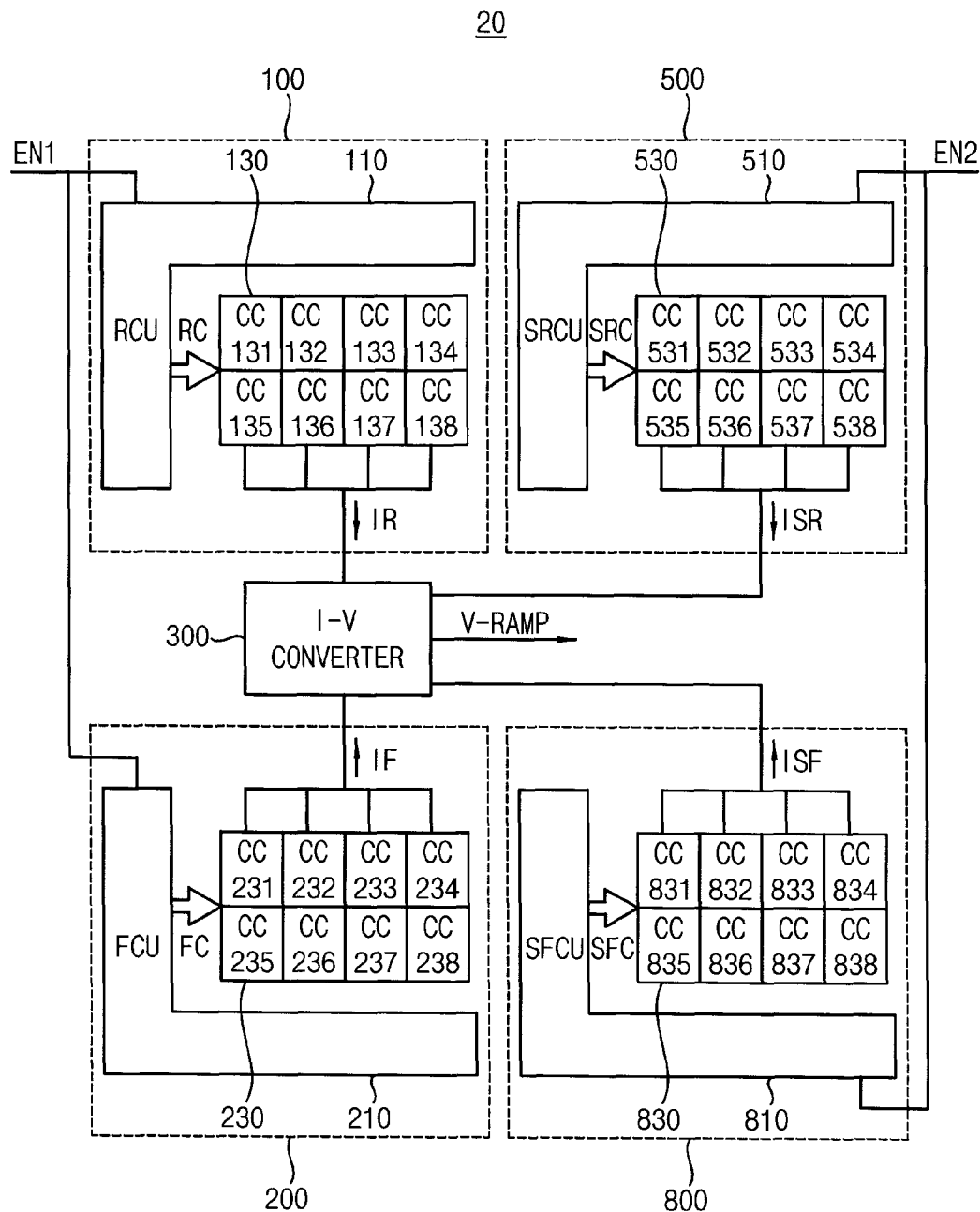
FIG. 7 is a block diagram illustrating a ramp signal generator according to exemplary embodiments in accordance with principles of inventive concepts.
Figure 8:
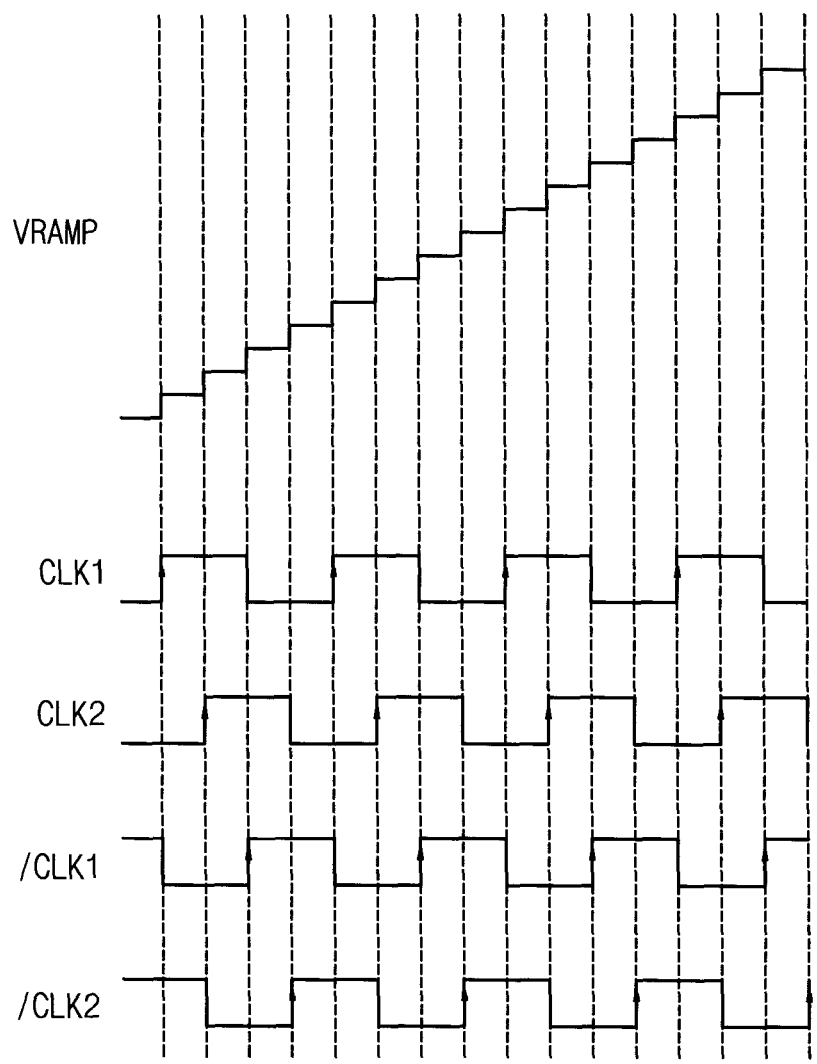
FIG. 8 is a timing diagram illustrating an operation of the ramp signal generator of FIG. 7.

FIG. 7 is a block diagram illustrating an exemplary embodiment of a ramp signal generator in accordance with principles of inventive concepts and FIG. 8 is a timing diagram illustrating operation of the ramp signal generator of FIG. 7. Ramp signal generator 20 may include a shift rising-edge current unit 500 and a shift falling-edge current unit 800.

The shift rising-edge current unit 500 may provide a shift rising-edge output current ISR that sequentially increases or decreases in synchronization with rising edges of a shift clock signal CLK2 that is phase-shifted by 90 degrees with respect to the clock signal CLK1. The shift falling-edge current unit 800 may provide a shift falling-edge output current ISF that sequentially increases or decreases in synchronization with falling edges of the shift clock signal CLK2. The current-voltage converter 300 may output the ramp voltage V-RAMP by converting the summed current IT of the rising-edge output current IR, the falling-edge output current IF, the shift rising-edge output current ISR and the shift falling-edge output current ISF.

In accordance with principles of inventive concepts, clock signal CLK1 and the shift clock signal CLK2 used in the rising-edge current unit 100, the falling-edge current unit 200, the shift rising-edge current unit 500 and the shift falling-edge current unit 800 may be supplied from outside the ramp signal generator 20. The rising-edge current unit 100 may generate the rising-edge output current IR such that the magnitude of the rising-edge output current IR is sequentially increased or decreased by a predetermined amount at every rising edge of the clock signal CLK1. The falling-edge current unit 200 may generate the falling-edge output current IF such that the magnitude of the falling-edge output current IF is sequentially increased or decreased by a predetermined amount at every falling edge of the clock signal CLK1. The shift rising-edge current unit 500 may generate the shift rising-edge output current ISR such that the magnitude of the shift rising-edge output current ISR is sequentially increased or decreased by a predetermined amount at every rising edge of the shift clock signal CLK2. The shift falling-edge current unit 800 may generate the shift falling-edge output current ISF such that the magnitude of the shift falling-edge output current ISF is sequentially increased or decreased by a predetermined amount at every falling edge of the shift clock signal CLK2.

The falling-edge current unit 200 may operate in response to an inversion (that is, inverted) clock signal /CLK1 of the clock signal CLK1. In this case, the falling-edge current unit 200 may provide the falling-edge output current IF sequentially increasing or decreasing in synchronization with rising edges of the inversion clock signal /CLK1.

The shift falling-edge current unit 800 may operate in response to an inversion (that is, inverted) shift clock signal /CLK2 of the shift clock signal CLK2. In this case, the shift falling-edge current unit 800 may provide the shift falling-edge output current ISF sequentially increasing or decreasing in synchronization with rising edges of the inversion shift clock signal /CLK2.

The current-voltage converter 300 may output ramp voltage V-RAMP by converting the summed current IT of the rising-edge output current IR, the falling-edge output current IF, the shift rising-edge output current ISR and the shift falling-edge output current ISF.

A ramp signal generator in accordance with principles of inventive concepts, such as ramp signal generator 20 may operate faster than conventional ramp signal generator that uses only the rising edges of a clock signal CLK1, because the ramp signal generator 20 generates the ramp signal in synchronization with both the rising edges and the falling edges of the clock signal CLK1. Additionally, in accordance with principles of inventive concepts, the shift rising edges and the shift falling edges of the shift clock signal CLK2 may be employed to generate ramp steps.

Referring to FIG. 3, FIG. 5, FIG. 7 and FIG. 8, the row select signals RRSS1, RRSS2, FRSS1 and FRSS2 and the column select signals RCSS1, RCSS2, RCSS3, RCSS4, FCSS1, FCSS2, FCSS3 and FCSS4 of FIG. 4 may be connected to row select switches 717 and column select switches 715, as illustrated in FIG. 5, respectively. In exemplary embodiments in accordance with principles of inventive concepts, if the first rising-edge row select signal RRSS1 and the first rising-edge column select signal RCSS1 are activated, the row select switch 717 and the column select switch 715 of the corresponding current cell of the rising-edge current unit 100 may be turned on. If the row select switch 717 and the column select switch 715 are turned on, the ground voltage VSS is applied to the input of the first inverter 713 of the latch circuit 711 and the rising switch signal SWS maintains the logic-high. As a result, the current switch 733 is turned on and the conduction path from the unit current source 731 to the current-voltage converter 300 is formed. The unit current IU may be transferred to the current-voltage converter 300 through the conduction path and the ramp voltage V-RAMP may be increased one step.

In accordance with principles of inventive concepts, if the first falling-edge row select signal FRSS1 and the first falling-edge column select signal FCSS1 are activated, the row select switch 717 and the column select switch 715 of the corresponding current cell of the falling-edge current unit 200 may be turned on. If the row select switch 717 and the column select switch 715 are turned on, the ground voltage VSS is applied to the input of the first inverter 713 of the latch circuit 711 and the falling switch signal SWS maintains a logic-high and the current switch 733 is turned on and the conduction path from the unit current source 731 to the current-voltage converter 300 is formed. The unit current IU may be transferred to the current-voltage converter 300 through the conduction path and the ramp voltage V-RAMP may be increased one more step.

In accordance with principles of inventive concepts, exemplary operations such as those generating the ramp voltage V-RAMP of FIG. 4 may be applied to the shift rising-edge current unit 500 and the shift falling-edge current unit 800 operating in synchronization with the shift clock signal CLK2.

If the first rising-edge row select signal RRSS1 and the first rising-edge column select signal RCSS1 are activated in synchronization with the rising edges of the shift clock signal CLK2, the row select switch 717 and the column select switch 715 of the corresponding current cell of the shift rising-edge current unit 500 may be turned on. If the row select switch 717 and the column select switch 715 are turned on, the ground voltage VSS is applied to the input of the first inverter 713 of the latch circuit 711 and the rising switch signal SWS maintains the logic-high. As a result, the current switch 733 is turned on and the conduction path from the unit current source 731 to the current-voltage converter 300 is formed. The unit current IU may be transferred to the current-voltage converter 300 through the conduction path and the ramp voltage V-RAMP may be increased one (more) step.

If the first falling-edge row select signal FRSS1 and the first falling-edge column select signal FCSS1 are activated in synchronization with the falling edges of the shift clock signal CLK2, the row select switch 717 and the column select switch 715 of the corresponding current cell of the shift falling-edge current unit 800 may be turned on. If the row select switch 717 and the column select switch 715 are turned on, the ground voltage VSS is applied to the input of the first inverter 713 of the latch circuit 711 and the falling switch signal SWS maintains a logic-high and the current switch 733 is turned on and the conduction path from the unit current source 731 to the current-voltage converter 300 is formed. The unit current IU may be transferred to the current-voltage converter 300 through the conduction path and the ramp voltage V-RAMP may be increased one more step, for example.

In accordance with principles of inventive concepts, a ramp signal may be formed repeating the process each cycle of the clock signal CLK1 and CLK2. If a ramp signal generator in accordance with principles of inventive concepts, such as the exemplary embodiment of ramp signal generator 20 is used, the ramp voltage V-RAMP may be increased by four steps each cycle of the clock signal CLK1 and CLK2.

If one of the rising-edge row select signals RRSS1 and RRSS2 or the rising-edge column select signals RCSS1, RCSS2, RCSS3 and RCSS4 is deactivated, the corresponding column select switch 715 or row select switch 717 of the current cells 131 to 138 of the rising-edge current unit 100 is deactivated. If the column select switch 715 or the row select switch 717 is deactivated, the initial state is maintained. The initial state may be the reset state in which the ground voltage VSS is applied to the input node of the second inverter 719 of the latch circuit 711. The rising switch signal SWS maintains the logic-low and the current switch 733 is turned off. If the current switch 733 is turned off, the conduction path from the unit current source 731 to the ground voltage VSS is formed. The unit current IU may be transferred to the ground through the conduction path and, as a result, the ramp voltage V-RAMP may not increase. The operations of the current cell deactivation of the rising-edge current unit 100 may be applied to the operations of the current cell deactivation of the falling-edge current unit 200.

In exemplary embodiments in accordance with principles of inventive concepts, rising-edge current unit 100 and the falling-edge current unit 200 may be activated selectively in response to an enable signal EN1 and shift rising-edge current unit 500 and the shift falling-edge current unit 800 may be activated selectively in response to a shift enable signal EN2.

In exemplary embodiments in accordance with principles of inventive concepts, if the enable signal EN1 is activated and the shift enable signal EN2 is deactivated, the ramp signal may be generated only using the rising-edge current unit 100 and the falling-edge current unit 200. In exemplary embodiments in accordance with principles of inventive concepts, if the enable signal EN1 is deactivated and the shift enable signal EN2 is activated, the ramp signal may be generated only using the shift rising-edge current unit 500 and the shift falling-edge current unit 800. In exemplary embodiments in accordance with principles of inventive concepts, if the enable signal EN1 and the shift enable signal EN2 are activated together, the ramp signal may be generated using the rising-edge current unit 100, the falling-edge current unit 200, the shift rising-edge current unit 500 and the shift falling-edge current unit 800.

In accordance with principles of inventive concepts, current units 100, 200, 500 and 800 may be deactivated in various ways. For example, in accordance with principles of inventive concepts, clock signal CLK1 and shift clock signal CLK2 may be stopped, particularly if they are supplied from the outside. If the clock signal CLK1 and the shift clock signal CLK2 are stopped, the control signals generated in synchronization with the rising or the falling edges of the clock signal CLK1 and the shift clock signal CLK2 may not be generated and, because control signals drive the current cell array and then generate the ramp voltage V-RAMP, if the control signals RC, FC, SRC and SFC are not generated, the current cell arrays 130, 230, 530 and 830 are not driven and the current units 100, 200, 500 and 800 may stop operation.

In other exemplary embodiments in accordance with principles of inventive concepts, operation of the control unit may be stopped. If the operation of the control unit is stopped including the node which deactivates the control unit, the control signals RC, FC, SRC and SFC may not generated and, as a result, the current cell arrays 130, 230, 530 and 830 are not driven and the current unit may stop the operation.

In other exemplary embodiments in accordance with principles of inventive concepts, unit current source 731 of the current cell arrays 130, 230, 530 and 830 may be stopped. If the operation of the unit current source 731 in the current cell array is stopped, the unit current source 731 in the current cell arrays 130, 230, 530 and 830 may not supply the unit current IU and the current unit may stop the operation even though the clock signal CLK1 and the shift clock signal CLK2 is supplied and the control unit operates.

Figure 9:
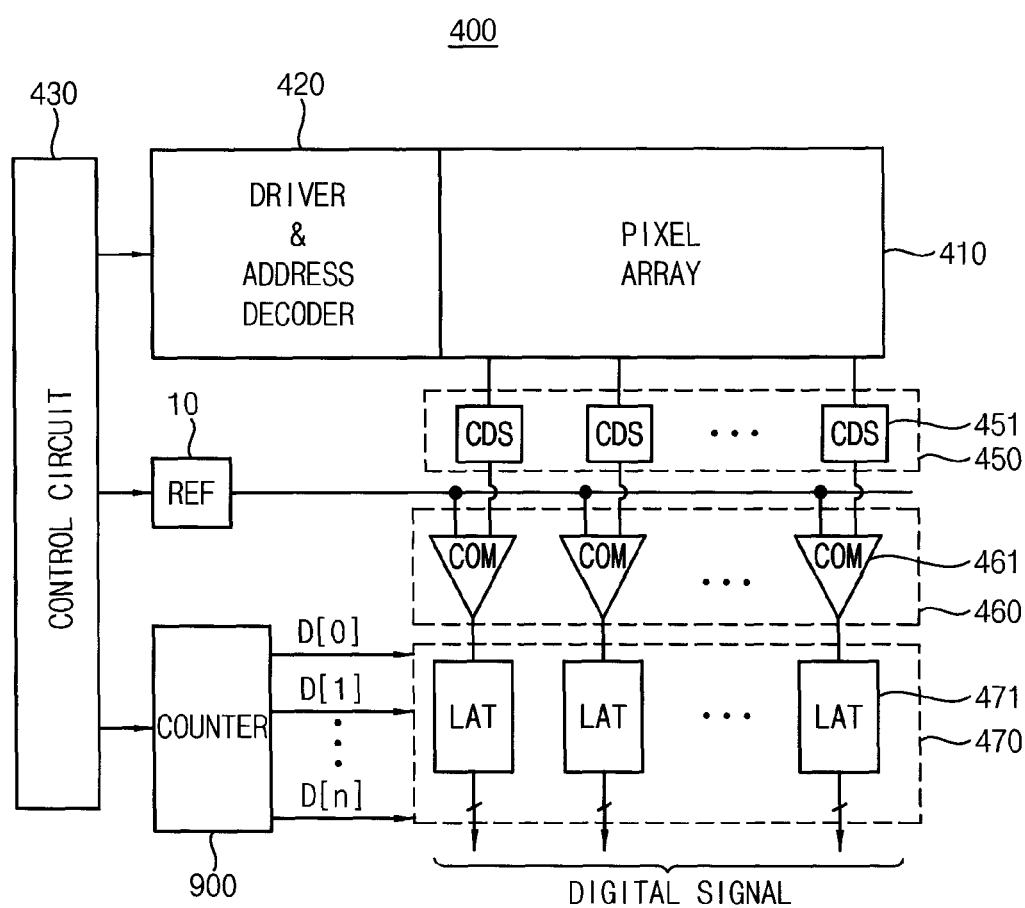
FIG. 9 is a block diagram illustrating an image sensor according to exemplary embodiments in accordance with principles of inventive concepts.

FIG. 9 is a block diagram illustrating an exemplary embodiment of an image sensor 400 in accordance with principles of inventive concepts and may be a CCD image sensor or a CMOS image sensor, for example. Image sensor 400 may include a pixel array including a plurality of pixels, a ramp signal generator 10 and a control unit 420, 430, 450, 460, 470 and 900. Ramp signal generator 10 may include a rising-edge current unit 100, a falling-edge current unit 200 and a current-voltage converter 300.

The pixel array 410, which includes a plurality of pixels, converts incident light to an electrical analog signal. The ramp signal generator 10 generates the ramp voltage V-RAMP. The control unit 420, 430, 450, 460, 470 and 900 outputs a digital signal corresponding to the electrical analog signal based on the ramp voltage V-RAMP.

The rising-edge current unit 100 may provide a rising-edge output current IR that sequentially increases or decreases in synchronization with rising edges of a clock signal CLK. The falling-edge current unit 200 may provide a falling-edge output current IF that sequentially increases or decreases in synchronization with falling edges of the clock signal CLK. The current-voltage converter 300 may output a ramp voltage V-RAMP by converting a summed current IT of the rising-edge output current IR and the falling-edge output current IF.

In exemplary embodiments of a CMOS image sensor in accordance with principles of inventive concepts, the pixel array 410 includes a plurality of unit pixels that are arranged in a matrix form. Each unit pixel converts an incident light into an electrical analog signal (e.g., analog pixel signal). When the image sensor includes unit pixels referred to as active pixels or gain cells, respective signal from each unit pixel is detected by an address control of the unit pixels. The active pixel sensor is a kind of address-controlled image sensor, and the driver/address decoder 420 controls operation of the pixel array 410 by unit of a column and/or a row. The control circuit 430 generates control signals for controlling operations of the other components of the image sensor 400.

In exemplary embodiments in accordance with principles of inventive concepts, analog signals detected by the pixel array 410 are converted into digital signals by the compare circuit 460, the latch circuit 470, and the counter circuit 900. The analog signals are output typically column by column. Thus the CDS circuit 450, the compare circuit 460 and the latch circuit 470 include a plurality of CDS units 451, a plurality of comparators 461 and a plurality of latches 471.

The analog signals output from the pixel array 410 include a respective reset signal RST and a respective measured image signal for each pixel. The respective reset signal RST represents respective fixed pattern noise (FPN) for the pixel and a respective logic circuit of the pixel. The respective measured image signal is generated from the pixel sensing incident light. A final image signal representing the intensity of incident light at each pixel is indicated by a subtraction of the respective reset signal RST from the respective measured image signal. Such a final image signal is generated from a correlated double sampling (CDS) process.

In exemplary embodiments in accordance with principles of inventive concepts, CDS circuit 450 performs analog double sampling (ADS) by generating a difference between the reset signal RST and the measured image signal using capacitors and switches. The CDS circuit 450 generates analog signals, each being a respective final image signal representing such a difference for each column. The compare circuit 460 compares the analog image signals for the columns of pixel from the CDS circuit 450 with the reference signal (for example, a ramp signal) from the ramp signal generator 10 in accordance with principles of inventive concepts to generate respective comparison signals for the columns. Each comparison signal has a respective transition time point that represents the level of the respective analog image signal. The bit signals from the counter 900 are commonly provided to all of the latches 471. Each latch 471 latches the bit signals from the counter 900 at the respective transition time point of the respective comparison signal to generate a respective latched digital signal of the respective final image signal for the respective column.

The ramp signal generator 10 in accordance with principles of inventive concepts operates faster than a conventional ramp signal generator using only the rising edges of the clock signal CLK, because the ramp signal generator 10 generates the ramp signal in synchronization with both of the rising edges and the falling edges of the clock signal CLK.

Figure 10:
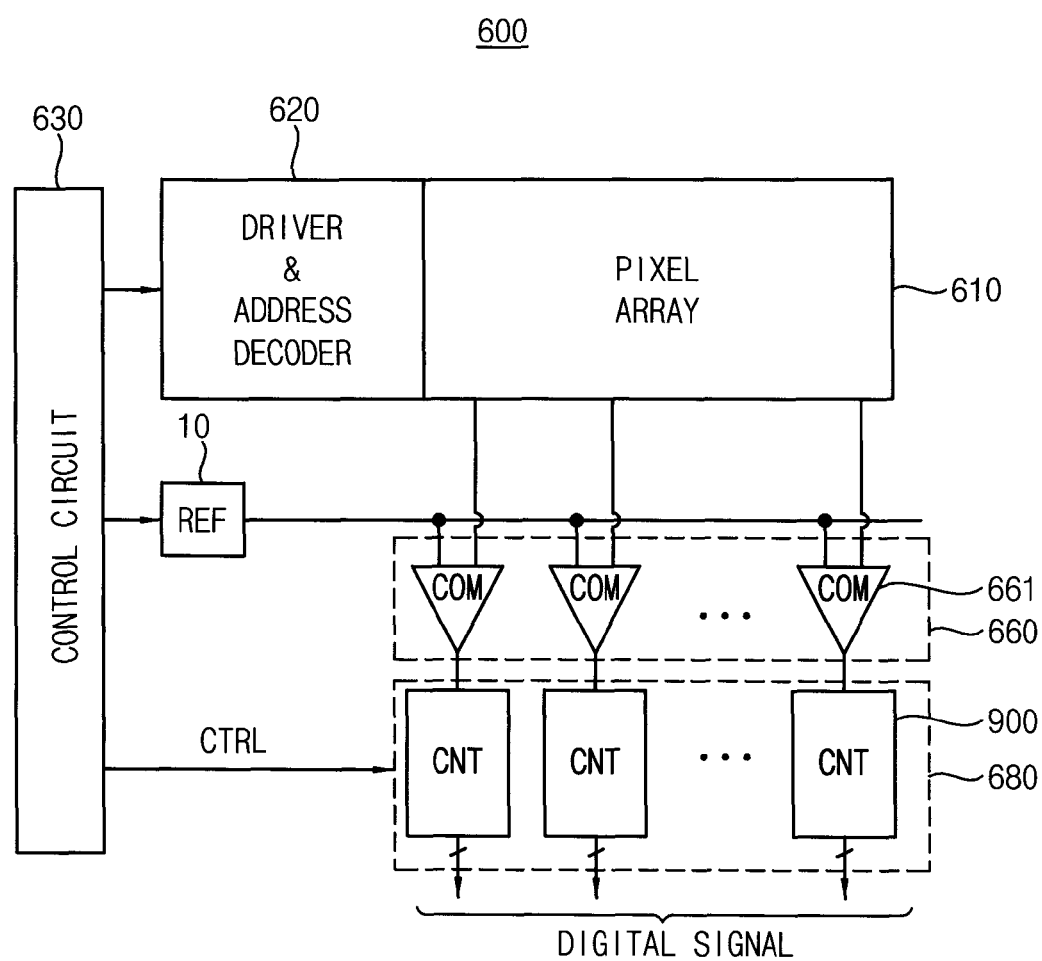
FIG. 10 is a block diagram illustrating an image sensor according to another exemplary embodiment in accordance with principles of inventive concepts.

An exemplary embodiment of an image sensor 600 in accordance with principles of inventive concepts is shown in the block diagram of FIG. 10. Image sensor 600 includes a pixel array 610, a driver/address decoder 620, a control circuit 630, a ramp signal generator 10, a counter circuit 680 and a compare circuit 660. The pixel array 610 includes a plurality of pixels for converting incident light into electrical analog signals. The driver/address decoder 620 controls operation of the pixel array 610 by each column and/or row. The control circuit 630 generates control signals for controlling operation of the components of the image sensor 600.

Analog signals generated by the pixel array 610 are converted into digital signals by the analog-to-digital conversion circuit implemented by the compare circuit 660 and the counter circuit 680. Analog signals are output column by column. Thus, the compare circuit 660 and the counter circuit 680 include a respective comparator 661 and a respective counter unit 900 for each column. Accordingly, the image sensor 600 simultaneously processes the analog signals for the columns of one row for enhanced operation speed and reduced noise.

In accordance with principles of inventive concepts, pixel array 610 sequentially outputs a respective reset signal RST and a respective measured image signal from a pixel for CDS. The compare circuit 660 and the counter circuit 680 performs CDS digitally on such reset and measured image signals for performing digital double sampling (DDS) for the columns of the pixel array 610.

A ramp signal generator 10 in accordance with principles of inventive concepts supplies the reference signal for comparisons. Such a ramp signal generator is than the conventional ramp signal generator using only the rising edges of the clock signal CLK, because the ramp signal generator 10 generates the ramp signal in synchronization with both of the rising edges and the falling edges of the clock signal CLK. Thus permitting faster conversion of analog signals and the concomitant ability to more readily convert signals from a greater number of pixels, such as may be present in a higher resolution imager in accordance with principles of inventive concepts.

Figure 11:
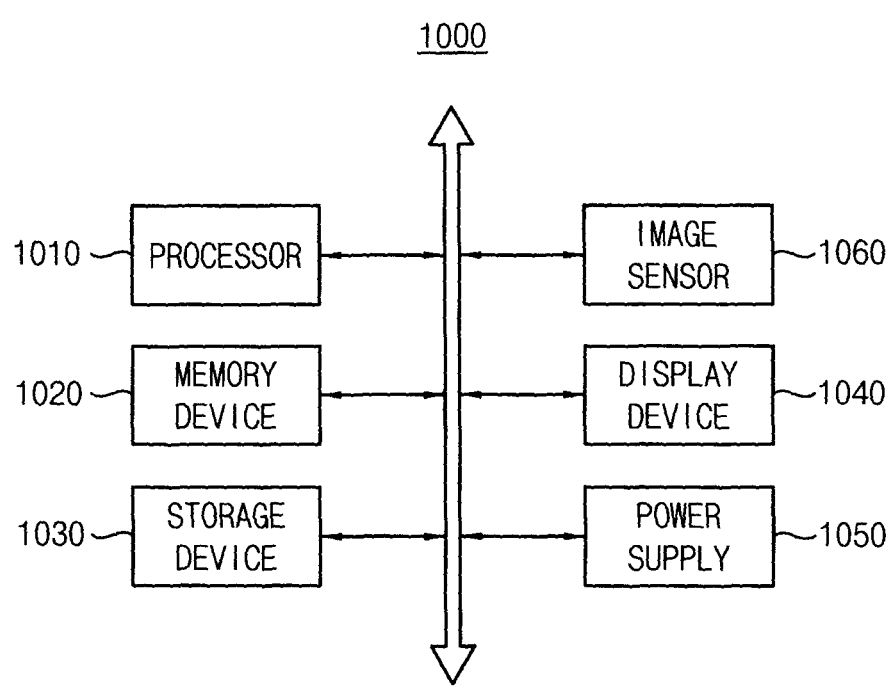
FIG. 11 is a block diagram illustrating a computing system including an image sensor in accordance with principles of inventive concepts.

FIG. 11 is a block diagram illustrating an exemplary embodiment of a computing system including an image sensor in accordance with principles of inventive concepts. Computing system 1000 may include a processor 1010, a memory device 1020, a storage device 1030, a display device 1040, a power supply 1050 and an image sensor 1060. Although not illustrated in FIG. 11, the computing system 1000 may further include ports that communicate with a video card, a sound card, a memory card, a USB device, other electronic devices, etc.

The processor 1010 may perform various calculations or tasks. In exemplary embodiments in accordance with principles of inventive concepts, the processor 1010 may be a microprocessor or a CPU, for example. The processor 1010 may communicate with the memory device 1020, the storage device 1030, and the display device 1040 via an address bus, a control bus, and/or a data bus. In some embodiments, the processor 1010 may be coupled to an extended bus, such as a peripheral component interconnection (PCI) bus. The memory device 1020 may store data for operating the computing system 1000. For example, the memory device 1020 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The storage device 1030 may include a solid state drive (SSD), a hard disk drive (HDD), a CD-ROM, etc. The computing system 1000 may further include an input device such as a touchscreen, a keyboard, a keypad, a mouse, etc., and an output device such as a printer, a display device, etc. The power supply 1050 supplies operation voltages for the computing system 1000.

The image sensor 1060 may communicate with the processor 1010 via the buses or other communication links. The image sensor 1060 may be integrated with the processor 1010 in one chip, or the image sensor 1060 and the processor 1010 may be implemented as separate chips.

The image sensor 1060 may include a ramp signal generator 10 in accordance with principles of inventive concepts described in the discussion related to FIG. 1 to FIG. 8. The ramp signal generator 10 may be faster than a ramp signal generator using only the rising edges of the clock signal CLK, because the ramp signal generator 10 generates the ramp signal in synchronization with the rising edges and the falling edges of the clock signal CLK.

At least a portion of the computing system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP). The computing system 1000 may be a portable electronic device using a ramp signal generator 10, e.g., a digital camera, a mobile phone, a smart phone, a portable multimedia player (PMP), a personal digital assistant (PDA), a computer, etc.

Figure 12:
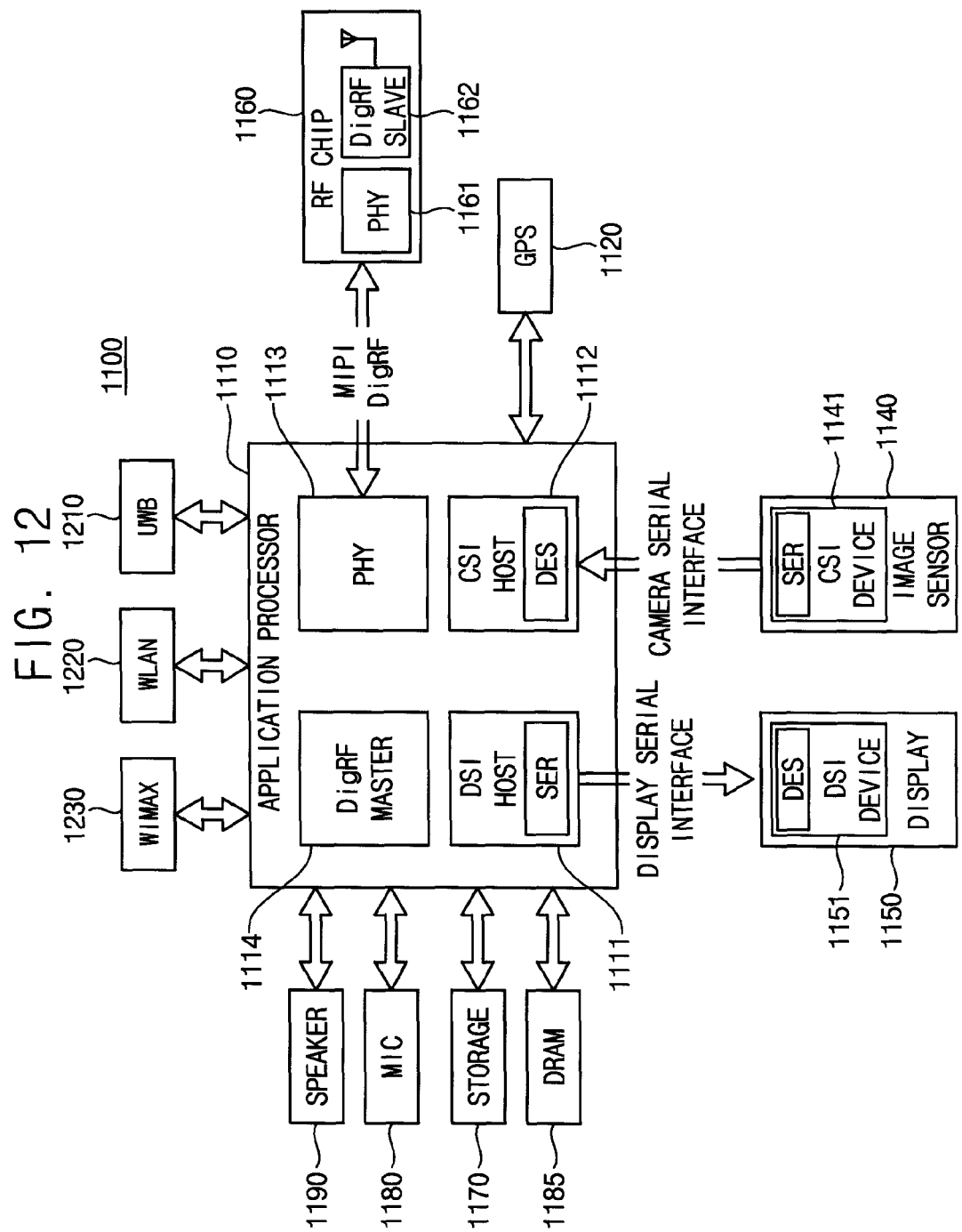
FIG. 12 is a block diagram illustrating an example of an interface used in the computing system of FIG. 11.

FIG. 12 is a block diagram illustrating an example of an interface used in the computing system of FIG. 11.

Referring to FIG. 12, a computing system 1100 may be implemented by a data processing device that uses or supports a mobile industry processor interface (MIPI) interface. The computing system 1100 may include an application processor 1110, an image sensor 1140, a display device 1150, etc. The display device 1150 may include the source driver according to example embodiments as described with reference to FIGS. 10 and 11. A CSI host 1112 of the application processor 1110 may perform a serial communication with a CSI device 1141 of the image sensor 1140 via a camera serial interface (CSI). In some embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some embodiments, the DSI host 1111 may include a serializer (SER), and the DSI device 1151 may include a deserializer (DES). The computing system 1100 may further include a radio frequency (RF) chip 1160 performing a communication with the application processor 1110. A physical layer (PHY) 1113 of the computing system 1100 and a physical layer (PHY) 1161 of the RF chip 1160 may perform data communications based on a MIPI DigRF. The application processor 1110 may further include a DigRF MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra wideband (UWB) 1120, a wireless local area network (WLAN) 1220, a worldwide interoperability for microwave access (WIMAX) 1130, etc. Other structures and interfaces of the electric device 1000 may also be used.

What is claimed is:

1. A ramp signal generator comprising:
a rising-edge current unit configured to provide a rising-edge output current sequentially increasing or decreasing in synchronization with rising edges of a clock signal;
a falling-edge current unit configured to provide a falling-edge output current sequentially increasing or decreasing in synchronization with falling edges of the clock signal; and a current-voltage converter configured to output a ramp voltage by converting a summed current of the rising-edge output current and the falling-edge output current.

2. The ramp signal generator of claim 1, wherein the ramp voltage increases by two steps per cycle of the clock signal.

3. The ramp signal generator of claim 1, wherein the rising-edge current unit includes:
   a rising-edge control unit configured to provide control signals in synchronization with the rising edges of the clock signal; and
   a rising-edge current cell array configured to provide the rising-edge output current by summing unit currents based on the rising control signals, and
wherein the falling-edge current unit includes:
   a falling-edge control unit configured to provide control signals in synchronization with the falling edges of the clock signal; and
   a falling-edge current cell array configured to provide the falling-edge output current by summing unit currents based on the falling control signals.

4. The ramp signal generator of claim 3, wherein the rising-edge control unit includes:
   a rising-edge row decoder configured to generate rising-edge row select signals in synchronization with the rising edges of the clock signal; and
   a rising-edge column decoder configured to generate rising-edge column select signals in synchronization with the rising edges of the clock signal, and
wherein the falling-edge control unit includes:
   a falling-edge row decoder configured to generate falling-edge row select signals in synchronization with the falling edges of the clock signal; and
   a falling-edge column decoder configured to generate falling-edge column select signals in synchronization with the falling edges of the clock signal.

5. The ramp signal generator of claim 4, wherein the rising-edge current cell array includes current cells providing the unit current respectively, the current cells configured to be turned on sequentially based on control signals generated by the rising-edge control unit, and
   wherein the falling-edge current cell array includes current cells providing the unit current respectively, the current cells configured to be turned on sequentially based on control signals generated by the falling-edge control unit.

6. The ramp signal generator of claim 5, wherein the current cells in the rising-edge current cell array and the falling-edge current cell array are turned off simultaneously in response to a reset signal and the current cells stop providing the unit currents simultaneously.

7. The ramp signal generator of claim 5, wherein each of the current cells in the rising-edge current cell array turns on when a corresponding rising-edge row select signal among the rising-edge row select signals and a corresponding rising-edge column select signal among the rising-edge column select signals are activated, and
   wherein each of the current cells in the falling-edge current cell array turns on when a corresponding falling-edge row select signal among the falling-edge row select signals and a corresponding falling-edge column select signal among the falling-edge column select signals are activated.

8. The ramp signal generator of claim 7, wherein the current cells of the rising-edge current cell array provide the unit currents continuously, even though the corresponding rising-edge row select signal or the corresponding rising-edge column select signal is deactivated, and
   wherein the current cells of the falling-edge current cell array provide the unit currents continuously, even though the corresponding falling-edge row select signal or the corresponding falling-edge column select signal is deactivated.

9. The ramp signal generator of claim 5, wherein each of the current cells in the rising-edge current cell array includes a rising switch signal generator configured to generate a rising switch signal that is activated in response to the corresponding rising-edge row select signal among the rising-edge row select signals and the corresponding rising-edge column select signal among the rising-edge column select signals, and
   wherein each of the current cells in the falling-edge current cell array includes a falling switch signal generator configured to generate a falling switch signal that is activated in response to the corresponding falling-edge row select signal among the falling-edge row select signals and the corresponding falling-edge column select signal among the falling-edge column select signals.

10. The ramp signal generator of claim 9, wherein each of the current cells in the rising-edge current cell array further includes a rising-edge unit current generator configured to provide the unit current in response to the rising switch signal from the rising switch signal generator, and
    wherein each of the current cells in the falling-edge current cell array further includes a falling-edge unit current generator configured to provide the unit current in response to the falling switch signal from the falling switch signal generator.

11. The ramp signal generator of claim 10, wherein the rising-edge unit current generator includes:
    a rising unit current source configured to provide the unit current; and
    a rising-edge current switch configured to connect the rising unit current source to the current-voltage converter in response to the rising switch signal, and
wherein the falling-edge unit current generator includes:
    a falling unit current source configured to provide the unit current; and
    a falling-edge current switch configured to connect the falling unit current source to the current-voltage converter in response to the falling switch signal.

12. The ramp signal generator of claim 11, wherein the rising-edge unit current generator further includes a rising-edge stop switch configured to connect the rising unit current source to a ground voltage in response to an inversion signal of the rising switch signal, and
    wherein the falling-edge unit current generator further includes a falling-edge stop switch configured to connect the falling unit current source to the ground voltage in response to an inversion signal of the falling switch signal.

13. The ramp signal generator of claim 1, wherein the current-voltage convertor includes a resistor connected between an output node of the ramp voltage and a ground voltage to convert the summed current to the ramp voltage.

14. The ramp signal generator of claim 1, further comprising:
    a shift rising-edge current unit configured to provide a shift rising-edge output current sequentially increasing or decreasing in synchronization with rising edges of a shift clock signal that is phase-shifted by 90 degrees with respect to the clock signal; and a shift falling-edge current unit configured to provide a shift falling-edge output current sequentially increasing or decreasing in synchronization with falling edges of the shift clock signal, wherein the current-voltage converter is configured to output the ramp voltage by converting the summed current of the rising-edge output current, the falling-edge output current, the shift rising-edge output current and the shift falling-edge output current.

15. The ramp signal generator of claim 14, wherein one of the rising-edge current unit and the falling-edge current unit is activated selectively in response to a enable signal, and wherein one of the shift rising-edge current unit and the shift falling-edge current unit is activated selectively in response to a shift enable signal.

16. An image sensor comprising:

a pixel array including a plurality of pixels configured to convert incident light to an electrical signal;

a ramp signal generator configured to generate a ramp voltage; and a control unit configured to output a digital electrical signal corresponding to the electronic signal based on the ramp voltage, wherein the ramp signal generator includes:

a rising-edge current unit configured to provide a rising-edge output current sequentially increasing or decreasing in synchronization with rising edges of a clock signal;

a falling-edge current unit configured to provide a falling-edge output current sequentially increasing or decreasing in synchronization with falling edges of the clock signal; and a current-voltage converter configured to output a ramp voltage by converting a summed current of the rising-edge output current and the falling-edge output current.

17. A portable electronic device, comprising:

a processor configured to receive digital data from an image sensor;

an image sensor, including:

a pixel array including a plurality of pixels configured to convert incident light to an electrical signal;

a ramp signal generator configured to generate a ramp voltage; and an analog to digital converter configured to compare electrical signals from the pixel array to a reference signal from a ramp signal generated by a ramp signal generator, wherein the ramp signal generator includes:

a rising-edge current unit configured to provide an output current sequentially increasing or decreasing in synchronization with rising edges of a clock signal;

a falling-edge current unit configured to provide an output current sequentially increasing or decreasing in synchronization with falling edges of the clock signal; and a current-voltage converter configured to output a ramp voltage by converting a summed current of the rising-edge output current and the falling-edge output current.

18. The portable electronic device of claim 17, wherein the portable electronic device includes a camera.

19. The portable electronic device of claim 18, wherein the portable electronic device is a smart phone.

20. The portable electronic device of claim 18, wherein the portable electronic device is a computer.

* * * * *